United States Patent [19]

Mazzucco et al.

[11] Patent Number: 4,835,490
[45] Date of Patent: May 30, 1989

[54] CIRCUIT FOR AUTOMATICALLY CONTROLLING THE GAIN-BANDWIDTH PRODUCT OF OPERATIONAL AMPLIFIERS

[75] Inventors: Michelangelo Mazzucco, Santa Maria Tempio; Vanni Poletto, Camino; Marco Siligoni, Vittuone, all of Italy

[73] Assignees: Cselt-Centro Studi E Laboratori Telecomunicazioni SPA, Turin; SGS Microeletronica SPA, Catania, both of Italy

[21] Appl. No.: 178,556

[22] Filed: Apr. 7, 1988

[30] Foreign Application Priority Data

Apr. 17, 1987 [IT] Italy .............................. 67330 A/87

[51] Int. Cl.$^4$ .............................................. H03G 3/30
[52] U.S. Cl. ..................................... 330/285; 330/140; 330/307
[58] Field of Search ............... 330/127, 129, 131, 138, 330/140, 142, 278, 279, 285, 295, 307

[56] References Cited

U.S. PATENT DOCUMENTS

| | | | |
|---|---|---|---|
| 3,967,208 | 6/1976 | Baylac et al. | 330/307 X |
| 4,439,744 | 3/1984 | Kumar et al. | 330/285 |
| 4,760,347 | 7/1988 | Li et al. | 330/140 X |

*Primary Examiner*—Steven Mottola
*Attorney, Agent, or Firm*—Herbert Dubno

[57] ABSTRACT

A circuit for automatically controlling the gain-bandwidth product of operation amplifiers, wherein gain-bandwidth product (G*B) of one of the amplifiers placed on the same chip as the amplifiers to be controlled is measured and the resulting signal is used to control through a bias circuit the gain-bandwidth products of all the amplifiers, the value of these products being presettable through the frequency of a control signal sent to the circuit input. The reference amplifier is highly compensated for and placed in the configuration of voltage follower.

2 Claims, 1 Drawing Sheet

CIRCUIT FOR AUTOMATICALLY CONTROLLING THE GAIN-BANDWIDTH PRODUCT OF OPERATIONAL AMPLIFIERS

The present invention concerns electronic circuits implemented by integrated circuits and more particularly a circuit for automatically controlling the gain-bandwidth product of operational amplifiers.

As known, integrated circuits comprising on a single silicon chip a plurality of operational amplifiers, sometimes already internally connected to RC networks so as to implement integrator circuits, are commercially available. Said circuits can be advantageously used to design integrated filters, since the number of external components required is very limited. More particularly, capacitors and external inductors can be avoided by the use of suitable techniques, e.g. of "Active R" type.

However, a number of disadvantages occurs in the industrial use of such type of filters. A first disadvantage is due to the limited accuracy of the single integrated elements, namely: transistors, resistors, capacitors, owing to unavoidable fabrication tolerances. As a consequence, the gain-bandwidth (G*B) product of the amplifiers or of the integrators of an integrated circuit is generally different from that of another integrated circuit. Since the filter cut-off frequency depends on that product, filters different from the computed ones are practically obtained. Hence, the necessity to provide at least a tuning element outside the integrated circuit, upon which a skilled technician could act during the initial adjusting-phase. Yet, this kind of operation is costly and requires a more complicated integrated-circuit, since suitable pins, connected to internal test points ough to be provided, which pins will be no longer used after tuning. This problem will become even more serious if the filter belongs to a rather complex system, e.g. a modem.

Another disadvantage is due to gain-bandwidth product variations dependent on temperature variations, affecting bias current ratios, integrated capacities, transistor parameters, et cetera. Of course this cannot be avoided by occasional adjustments, but an automatic control system is required.

The desired filter is to require neither initial tunings, whatever the integrated circuit employed, nor adjustments during the operation, owing to thermal drifts. Its cut-off frequency ought to be certainly determined a priori and not to depend on the integrated-circuit characteristics.

Some systems for automatically controlling the gain-bandwidth product are already known in the literature, more particularly two systems of this kind are described in the article entitled "Continuous-time MOSFET-C Filters in VLSI" by Yannis Tsividis et alii, issued on IEEE Journal of solid-state circuits, Vol. SC-21, No. 1, February 1986, pages 15-29 and shown in FIGS. 1(b) and 1(c).

These are indirect methods, i.e. methods in which the control of gain-bandwidth product is carried out on one or more amplifiers placed on the same silicon chip, whereupon the amplifiers actually used to implement the filter are present. Undergoing the same phases of the technological process, fabrication tolerances are the same, and being in close proximity on the chip, temperature variations are common to all the amplifiers. One or more amplifiers can then be used to measure G*B and to extract a signal proportional to it, which controls G*B of all the amplifiers present in the same integrated circuit. More particularly this error signal can be used to control bias currents, whereupon amplifier G*Bs can depend.

Said methods are also called "indirect tuning" methods, since, by controlling G*Bs, filter cut-off frequencies are controlled; these filters hence become tunable at the desired frequencies on the basis of a previous programmation.

According to the method of the system shown in FIG. 1(b) of the cited article, at least two operational amplifiers are used to implement a reference filter of the "biquad" type, to whose input a predetermined-frequency clock signal is sent. Said signal is also sent to a comparison circuit, which compares its phase with the phase of the sme signal extracted at the filter output. An error signal is obtained from the comparison, which acting on the filter amplifiers keeps the phase difference at the chosen frequency at a predetermined and constant value, recovering in this way fabrication tolerances and temperature variations. This method requires at the input a sinusoidal signal, which generally presents some difficulties in an environment where mainly digital signals are found and occupies at least two amplifiers and other elements for implementing reference filter. Besides the method demands a four-quadrant analog multiplier for implementing the comparison circuit. As known, the design of this multiplier presents considerable difficulties due to circuit complexity, since nonlinearity introduced by transistors ought to be avoided.

The relation between the G*B product and the signal frequency at the reference-filter input is also rather difficult to compute.

According to the method of the system shown in FIG. 1(c), at least two amplifiers are interconnected to obtain a voltage-controlled oscillator. The signal produced is compared in a phase-comparator with a reference-signal coming from the outside and the error signal, duly filtered, is used to stabilize the integrated-oscillator frequency. Thus the well-known "phase-locked loop", or PLL, is implemented. Since the fabrication tolerances of the integrated circuit which comprises the amplifiers and temperature variations determine corresponding variations in the frequency of the signal generated by the voltage-controlled oscillator, its correction based on the frequency of the external signal causes the correction of the G*B products of all the amplifiers. This system unfortunately requires a further filter to limit residual ripple of error signal, and hence a further external capacitor. In fact it is not advisable to obtain this operation from the loop-filter alone, implementing it with very-low cut-off frequency, as locking difficulties could arise. The whole system ought to be designed as well as possible so as to always ensure integrated oscillator locking to the reference phase, otherwise G*B product control might be lost. This system requires also a circuit for the control of the signal level at the output of the voltage-controlled oscillator, in order to prevent if from being blocked at one of the power-supply voltage levels (+Vcc, −Vcc) owing to input voltage drift.

The disadvantages above are overcome by the circuit for automatically controlling the gain-bandwidth product of operational amplifiers, provided by the invention, which allows the indirect control of G*B product through the frequency of a square-wave signal sent to the input, requires the use of an only external capacitor and a single operational amplifier to measure the G*B product and whose circuitry is easy to implement, also as an integrated circuit.

The present invention provides a circuit for automatically controlling the gain-bandwidth product of operational amplifiers, wherein gain-bandwidth product G*B of one of the amplifiers placed on the same chip as the amplifiers to be controlled is measured and the resulting signal is used to control through a bias circuit the gain-bandwidth products of all the amplifiers, the value of these products being presettable through the frequency of a control signal sent to the circuit input, characterized in that it comprises:

a squaring circuit, which receives at the input said control signal with predetermined frequency and duty-cycle equal to 50 percent and supplies at the output a corresponding square-wave signal with positive or negative amplitude equal to that of a reference voltage;

a source of that reference voltage;

one of said operational amplifiers, highly compensated for so as to present at very low frequency the first pole of the transfer function and placed in the voltage-follower configuration, which amplifier receives at the non-inverting input the signal supplied at the output by said squaring circuit;

a rectifying circuit, which receives at the input the signal supplied by said operational amplifier;

a voltage-to-current converter with a transfer function equal to a first resistive value, which receives at the input a voltage signal and converts it into a current signal at the output;

a constant-current generator; which supplies a current equal to said reference voltage divided by a second resistive value and has a terminal connected to the source of negative voltage and the other terminal connected to the output of the voltage-to-current converter;

a capacitor, with a terminal connected to the negative voltage source and the other terminal connected to the output of the voltage-to-current converter and to the input of said bias circuit, which controls amplifier gand-bandwidth product in a way inversely proportional to the voltage across the capacitor terminals.

The foregoing and other characteristics of the present invention will be made clearer by the following description of a preferred embodiment thereof, given by way of non-limiting example, and by the annexed drawings in which.

The circuit described hereinbelow carries out the measurement of gain-bandwidth product by using one of the operational amplifiers highly compensated for, so as to present at very low frequency the first pole of the transfer function. This can be obtained by the use of a low value capacitor, which can be already integrated. As known such an amplifier acts as a low-pass RC network, with a cut-off frequency dependent on G*B product, when connected as voltage follower. More particularly, transfer function is given by $G*B/(s+G*B)$, where s is the complex variable and G*B product represents the inverse of time constant.

By measuring the modifications made by such a circuit to a square-wave signal sent to its input, G*B product value can be derived and possibly corrected so as to bring it again to the predetermined value.

Figure 1:
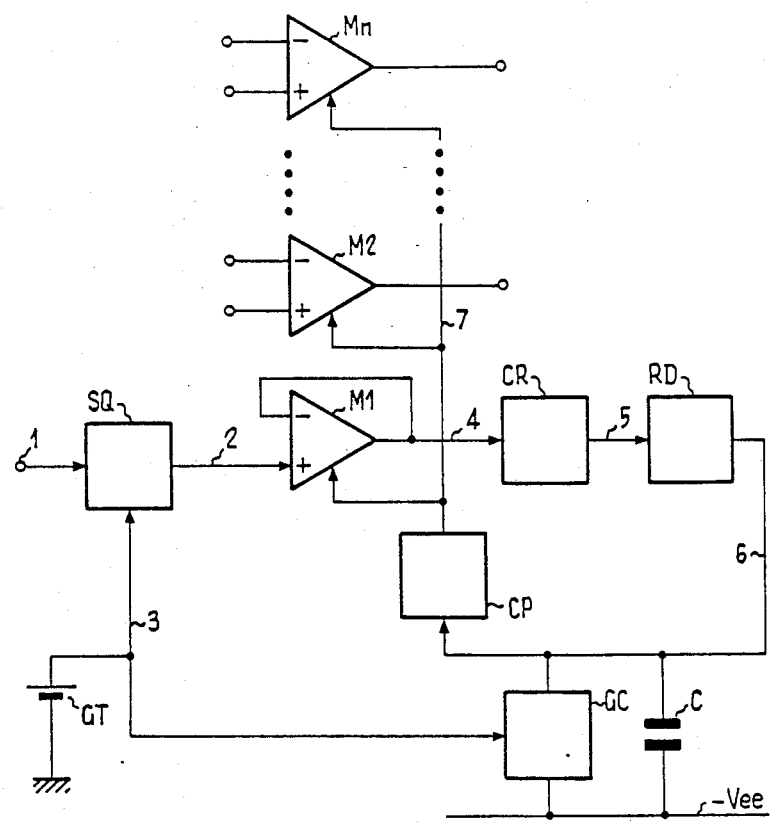
FIG. 1 is a block-diagram of the circuit provided by the invention.

The square-wave control signal arrives at the wire denoted by reference 1 on FIG. 1, connected to the input of a squaring circuit SQ, which receives also on wire 3 a dc reference voltage Ao generated by a suitable source GT. This control signal presents a duty-cycle equal to 50 percent and a frequency fc of convenient value to the G*B product desired. More particularly, in the domain of linearity of the various circuit blocks and by a suitable choice of some circuit elements, the relation becomes particularly simple: $G*B=0.3497*fc$.

At the output on wire 2 there is a signal equal to the one present on wire 1, but with positive and negative levels equal to Ao and $-$Ao respectively. Said signal is sent to the non-inverting input of one of the operational amplifiers, M1, placed in the voltage-follower configuration. The other amplifiers M2, ..., Mn can be used to carry out the desired functions, for example for filtering functions, their G*B products undergoing an indirect control by the frequency of the signal on wire 1.

Figure 2:
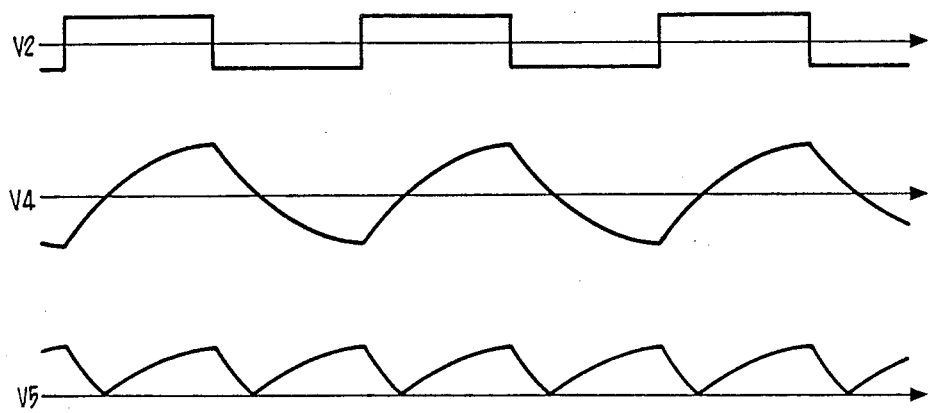
FIG. 2 is a time diagram of the main waveforms.

At the output of amplifier M1, connected to wire 4, a signal is obtained with a waveform similar to that denoted by V4 in FIG. 2. It consists of a sequence of exponentially decreasing and increasing ramps with the time constant of the transfer function of the low-pass network implemented by amplifier M1.

Said signal on wire 4 is sent to the input of a rectifying circuit denoted by CR in FIG. 1, obtaining at the output on wire 5 a signal similar to that denoted by V5 in FIG. 2. It consists of a sequence of positive-amplitude and exponentially-increasing ramps.

The signal supplied by CR on wire 5 is sent to a voltage-to-current converter, denoted by RD in FIG. 1, with transfer function equal to Ri1. This converter is designed to convert input ramp voltage into current, by dividing it by a resistence Ri1 of suitable value, as will be better expounded hereinbelow. Mean current value depends on the amplitude of the reference voltage Ao, on the amplifier G*B product, on the frequency fc of the signal on wire 1 and on the resistance Ri1, according to a rather complex relation. More particularly, it results directly proportional to Ao.

The current signal, present on wire 6, is used to charge a capacitor C, with the other terminal connected to the negative power-supply voltage $-$Vee. The capacitor is also discharged through a constant-current generator GC, slaved to reference voltage source GT, so that the current traversing it be equal to Ao/Ri2. The most suitable value of Ri2 will be determined hereinafter together with the value of Ri1.

It is clear that capacitor C keeps a charge constant only if the mean value of the current supplied by RD is equal to the value of the current drawn by GC.

Since both the current supplied by RD and the current drawn by GC are directly proportional to the value of voltage Ao generated by GT, its possible variation does not affect the quantity of charge accumulated by capacitor C. The voltage present across capacitor C controls a bias circuit, denoted by CP in FIG. 1, which by varying the currents sent to the operational amplifiers on wire 7, controls their G*B products. More particularly G*B value is inversely proportional to the voltage across C.

An undesired G*B increase causes a reduction in the time constant of integrator M1 and hence a more rapid increase of the voltage ramp at its output. That causes an increase in the mean value of the current which charges capacitor C and as a consequence a higher voltage at its terminals, which causes a reduction of G*B product through bias circuit CP, with consequent correction of its value.

Supposing on the contrary that a reduction of G*B product is desired, the frequency of the signal at input 1 is reduced, thus obtaining a proportionally more rapid increase of the ramp at the output of integrator M1 and a higher mean value: in fact the response of a low-pass network to a lower-frequency signal is more rapid. Then corrections are carried out as in the preceding case of non-desired G*B increase.

The quite simple value of the ratio between G*B and fc, already mentioned, can be obtained by a convenient choice of the ratio between Ri1 and Ri2. More particularly, it is possible to demonstrate that G*B=0.3497*fc by choosing Ri1/Ri2 equal to 0.261857 and peak value of V5 (FIG. 2) equal to Ao/2.

It is clear that what described has been given only by way of a non-limiting example. Variations and modifications are possible without going out of the scope of the present invention.

We claim:

1. A circuit for automatically controlling gain-bandwidth products of operational amplifiers, wherein the gain-bandwidth product (G*B) of one of the amplifiers (M1) placed on a same chip as the amplifiers to be controlled (M2, ... Mn) is measured and a resulting signal is used to control through a bias circuit (CP) the gain-bandwidth products of all the amplifiers, the value of these products being presettable through the frequency (fc) of a control signal sent to a circuit input (1), characterized in that it comprises:

a squaring circuit (SQ), which receives at the input (1) said control signal with a predetermined frequency (fc) and duty-cycle equal to 50 percent and supplies at an output (2) a corresponding square-wave signal with positive or negative amplitude equal to that of a reference voltage (Ao);

a source (GT) of that reference voltage;

one of said operational amplifiers (M1), highly compensated for so as to present at a very low frequency a first pole of a transfer function and placed in a voltage-follower configuration, which amplifier receives at a non-inverting input the signal supplied at the output (2) of said squaring circuit (SQ);

a rectifying circuit (CR), which receives at an input (4) the signal supplied by said operational amplifier (M1);

a voltage-to-current converter (RD) with a transfer function equal to a first resistive value (Ri1), which receives at an input (5) a voltage signal and converts it into a current signal at an output (6);

a constant-current generator (GC), which supplies a current equal to said reference voltage (Ao) divided by a second resistive value (Ri2) and has a terminal connected to a source of negative voltage (−Vee) and an other terminal connected to the output (6) of the voltage-to-current converter (RD);

a capacitor (C), with a terminal connected to the negative voltage source (−Vee) and the other terminal connected to the output (6) of the voltage-to-current converter (RD) and to the input of said bias circuit (CP), which controls amplifier gain-bandwidth product in a very inversely proportional to the voltage across the capacitor terminals.

2. A circuit as in claim 1, characterized in that the gain-bandwidth product (G*B) is equal to the frequency of the control signal (fc) multiplied by 0.3497 and the ratio between the resistences of said resistive values (Ri1,Ri2) is equal to 0.261857.

* * * * *